United States Patent [19]

Sato et al.

[11] Patent Number: 5,528,187
[45] Date of Patent: Jun. 18, 1996

[54] CLOCK SYNCHRONIZING CIRCUIT

[75] Inventors: Hiroshi Sato; Katsunori Seno, both of Kanagawa, Japan

[73] Assignee: Sony Corporation, Tokyo, Japan

[21] Appl. No.: 229,787

[22] Filed: Apr. 19, 1994

[30] Foreign Application Priority Data

Apr. 28, 1993 [JP] Japan ................... 5-102486

[51] Int. Cl.⁶ .................. H04L 7/00; H03K 5/13
[52] U.S. Cl. ................. 327/292; 327/298; 327/141
[58] Field of Search ................... 327/291–298, 327/141, 146, 147, 155, 156, 231, 233, 243, 244; 326/93, 101

[56] References Cited

U.S. PATENT DOCUMENTS

| 4,761,799 | 8/1988 | Arragon | 375/107 |
| 4,862,158 | 8/1989 | Keller et al. | 340/825.050 |
| 4,998,262 | 3/1991 | Wiggers | 375/107 |
| 5,361,277 | 11/1994 | Grover | 375/107 |

*Primary Examiner*—Timothy P. Callahan
*Assistant Examiner*—T. Lam
*Attorney, Agent, or Firm*—Ronald P. Kananen

[57] ABSTRACT

Clock signals of the same phase are formed even when signal delays occur in clock signals transmitted on a clock line. In a clock synchronizing circuit which synchronizes circuit elements using clock signals taken from a common clock line, the clock line is bent midway into a pair of clock lines, and a center phase signal generating means generates a clock signal having a phase which is in the center of two clock signals of differing phase obtained from arbitrary points on the pair of clock lines which are at equal distances from the point at which the clock line is bent over. By using pairs of clock signals of differing phases taken at equal distances from the bend over point, three clock signals all having equal phase are obtained.

4 Claims, 12 Drawing Sheets

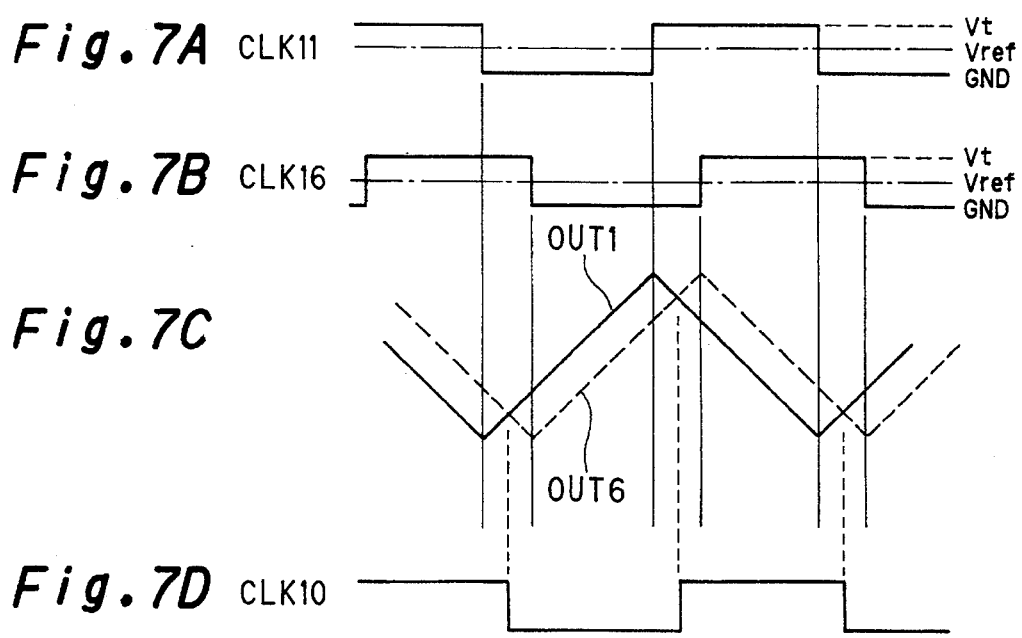

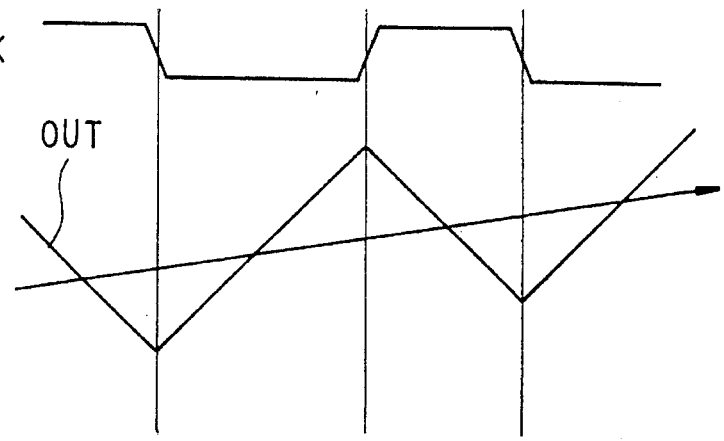
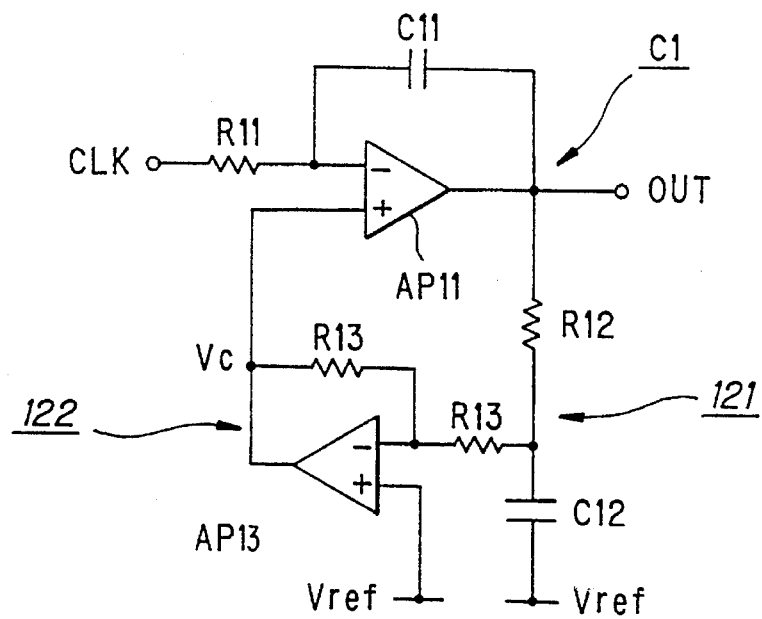

Fig. 12A CLK 
Fig. 12B CLK20 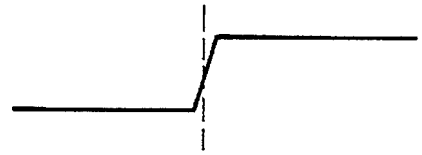
Fig. 12C CLK21 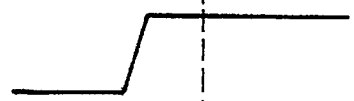
Fig. 12D CLK24 
Fig. 12E CLK20a 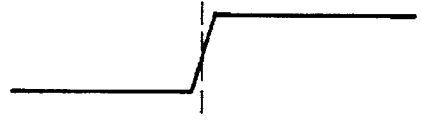
Fig. 12F CLK22 
Fig. 12G CLK23 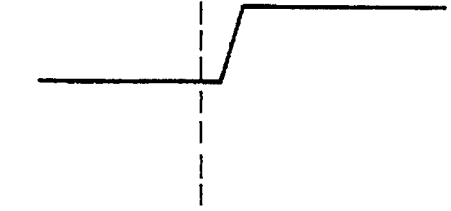

CLOCK SYNCHRONIZING CIRCUIT

BACKGROUND OF THE INVENTION

1. Field of the Invention

This invention relates to a clock synchronizing circuit, and more particularly to a clock synchronizing circuit suited to use in a usual digital system.

2. Description of the Related Art

An example of a synchronizing circuit for the related art is shown in FIG. 1. In this specification, clock synchronizing circuits and synchronizing circuit elements carry out signal processing and logic operations while connected with each other via clock signals taken from a common clock line.

The synchronizing circuit in FIG. 1 actually consists of a number of flip-flops and gates connected together in cascade but in this diagram just the combination of the three flip-flops FF1 to FF3 and the two gates G1 and G2 is shown.

In this diagram, data DT is sent to the input of the D-type flip-flop FF1 via the terminal 101. The data DTa outputted from the D-type flip-flop FF1 is sent to the gate G1, and the data DTb outputted from this gate G1 is then sent to the input terminal D of the D-type flip-flop FF2. The data DTc outputted from the D-type flip-flop FF2 is sent to the gate G2 and the data DTd outputted from this gate G2 is then sent to the input terminal D of the D-type flip-flop FF3.

The character L indicates the line that provides the clock signal (clock line), with the clock signal CLK being provided via input terminal 102. Clock signals CLK 1, CLK 2 and CLK 3 are then provided via the clock line L, which is the nearest, to each of the flip-flops FF1, FF2 and FF3. As a signal delay occurs depending on the length of the clock line L, the clock signals CLK 1 to CLK 3 are not of equal phase.

FIG. 2 is a timing diagram for describing this relationship.

The data DT1 (=DT) provided to the input terminal D of the D-type flip-flop at the time t0 shown in FIG. 2B is taken into the D-type flip-flop FF1 on the rising edge of the clock signal CLK 1 at the time t1 shown in FIG. 2A. The period of time until the time t2 when the data DT1 which was taken in is outputted from the output terminal Q as the data DTa1 is the period of time for processing within the D-type flip-flop tFF, which is the internal delay time within the D-type flip-flop FF1.

The period of time between the time t2 and the data DTa1 undergoing prescribed signal processing before being outputted from the output terminal as the data DTb1 at the time t4 is tG. There is also the time known as the wiring delay time tSK (skew) between the time t1 at which the clock signal CLK 1 rises and the time t3 at which the clock signal CLK 2 rises and the time period known as the "hold time" tHOLD between the times t3 and t4.

A specific example of other parts of the circuit shown in FIG. 1 is shown in FIG. 3.

In the example in FIG. 3, registers R11 to R13 made up of D-type flip-flops are arranged in front of and behind an arithmetic logic unit (ALU). The clock signal CLK is provided to the circuit from the terminal 106 so as to provide synchronized operation. Numerals 103 and 104 indicate terminals for inputting data. Signal delays also occur between the clock signals provided to each of the registers R11 to R13 in this kind of circuit construction the signals going around the clock line L.

Skew which accompanies the formation of the line L (the clock line) for providing the clock signal CLK also occurs.

The skew depends on the place from which these signals are taken and if these positions are different the skew becomes large. This means that the hold time tHOLD for the D-type flip-flop FF in the next stage becomes short, so that in the worst case the correct data is not latched and errors occur.

SUMMARY OF THE INVENTION

It is the object of this invention to provide a clock synchronizing circuit where shifts in phase between clock signals due to skewing do not occur.

In order to solve this problem, a clock synchronizing circuit which synchronizes circuit elements using clock signals taken from a common clock line, with the clock line being bent midway to form a pair of clock lines, comprises center phase signal generating means for generating a clock signal having a phase which is midway between that of two clock signals of differring phase, the two clock signals having been taken from arbitrary points on the pair of clock lines at equal distances from the point at which the pair of clock lines are bent over.

Also, a clock synchronizing circuit which synchronizes circuit elements using clock signals taken from a common clock line, with the clock line being bent midway to form a pair of clock lines, comprises center phase signal generating means for generating a clock signal having a phase which is midway between that of two clock signals of differring phase, the two clock signals having been taken from arbitrary points on the pair of clock lines at equal distances from the point at which the pair of clock lines are bent over and a PLL set up between the center phase signal generating means and the clock line, for adjusting the phase of the clock signal outputted from the center phase signal generating means to the phase of an external clock.

In FIG. 4, the clock line L is bent over at a bend over point PO into a pair of clock lines La and Lb. Pairs of clock signals CLK of differring phases are taken from the clock lines La and Lb at equal distances from the bend over point PO and are then sent to the center phase generators M1 to M3.

Clock signals CLK 10 having phases which are in the middle of the phases of the pair of clock signals obtained from the pair of clock lines La and Lb are then generated at the center phase generators M1 to M3. As the clock signals are taken from the clock lines La and Lb at distances which are equal taking the bend over point PO as standard for all of the center phase generators M1 to ME3, the center phase clock signal obtained from each of the center phase generators M1 to M3 is of the same phase.

BRIEF DESCRIPTION OF THE DRAWINGS

FIG. 7, comprised of FIGS. 7A–7D is a view describing the operation of the center phase generator in FIG. 6;

FIG. 8, comprised of FIGS. 8A–8B is a view describing the d.c. drift;

FIG. 9 is a circuit diagram of an integrator for a third embodiment of this invention which is not affected by the duty ratio of the clock signal;

FIG. 12, comprised of FIGS. 12A–12G is a view describing the synchronization of the clock signals when the PLL system in FIG. 11 is used;

DETAILED DESCRIPTION OF THE PREFERRED EMBODIMENTS

First Embodiment

Figure 1:
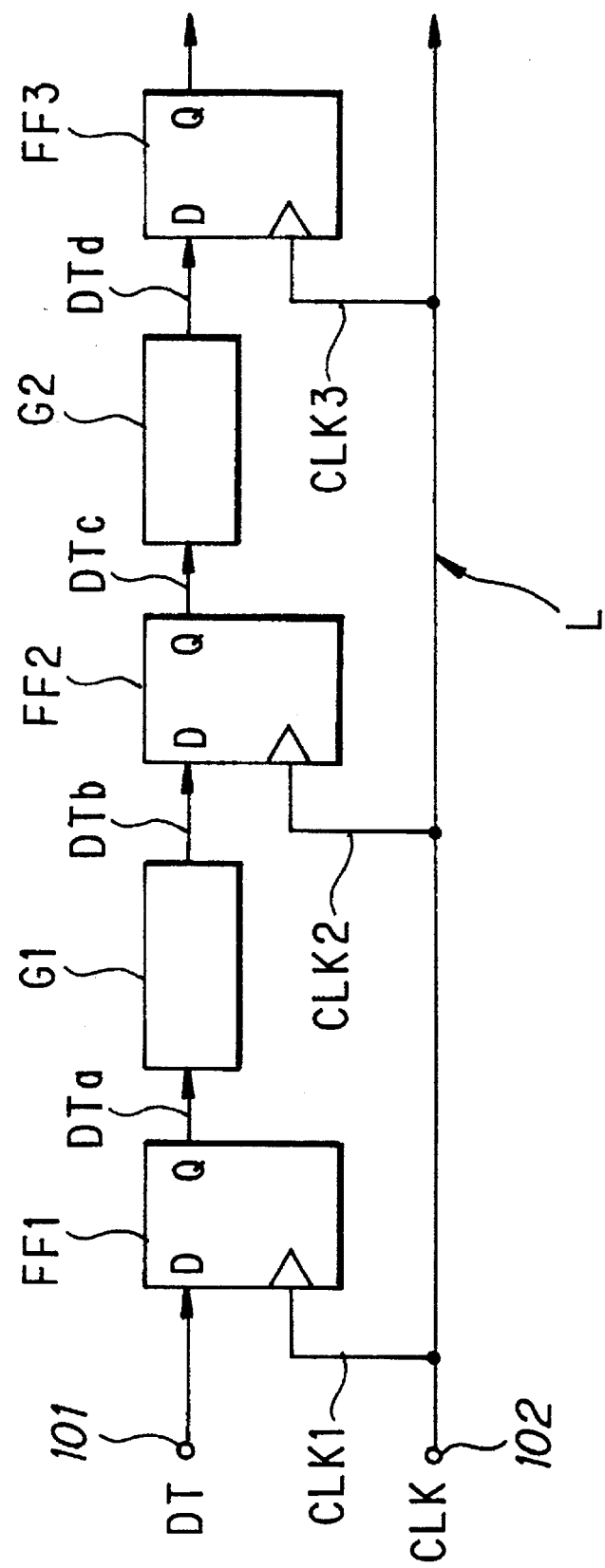
FIG. 1 is a block diagram of a synchronizing circuit for an example of the related art.
Figure 2:
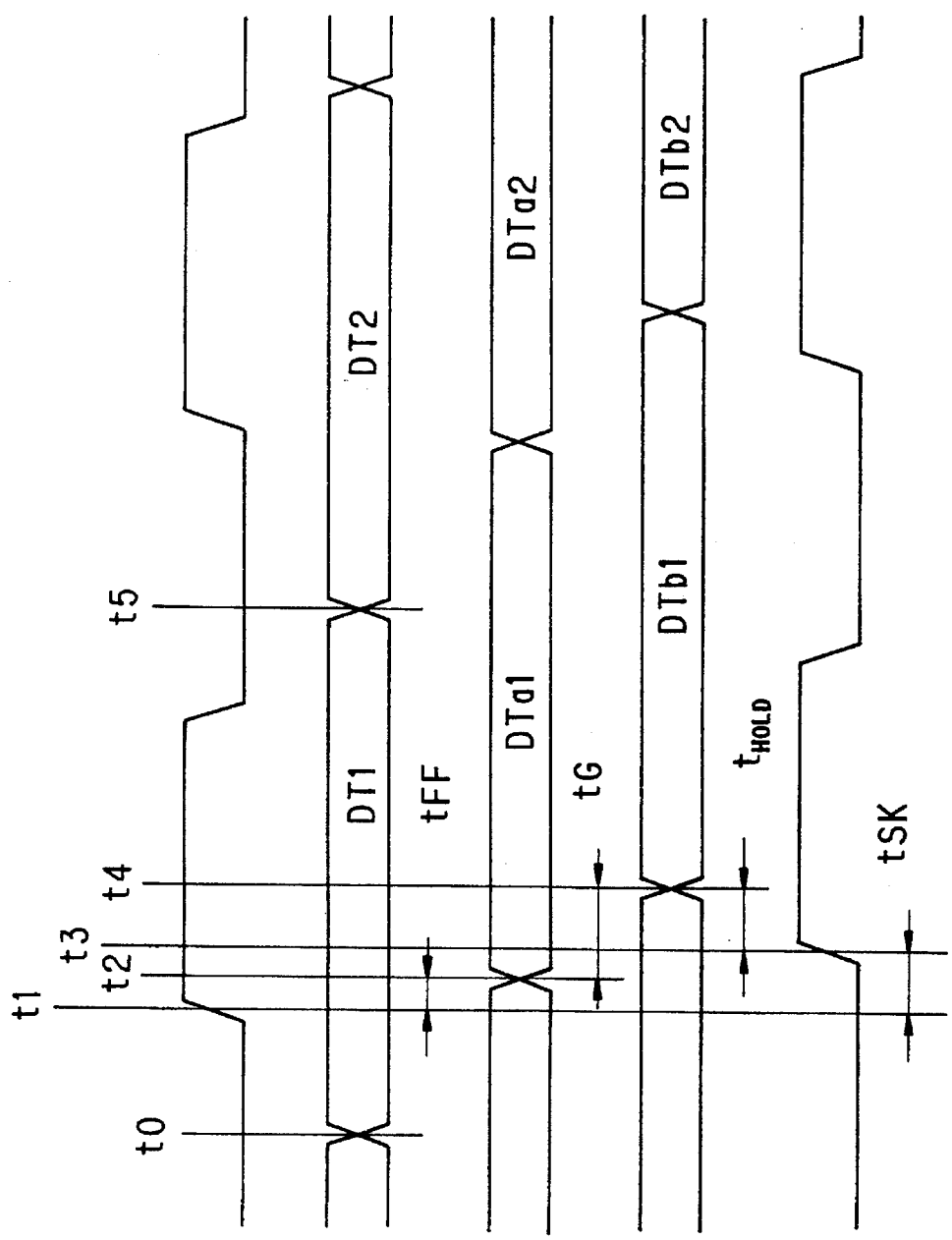
FIG. 2 is a timing diagram describing the generation of skew in the synchronizing circuit in FIG. 1.
Figure 3:
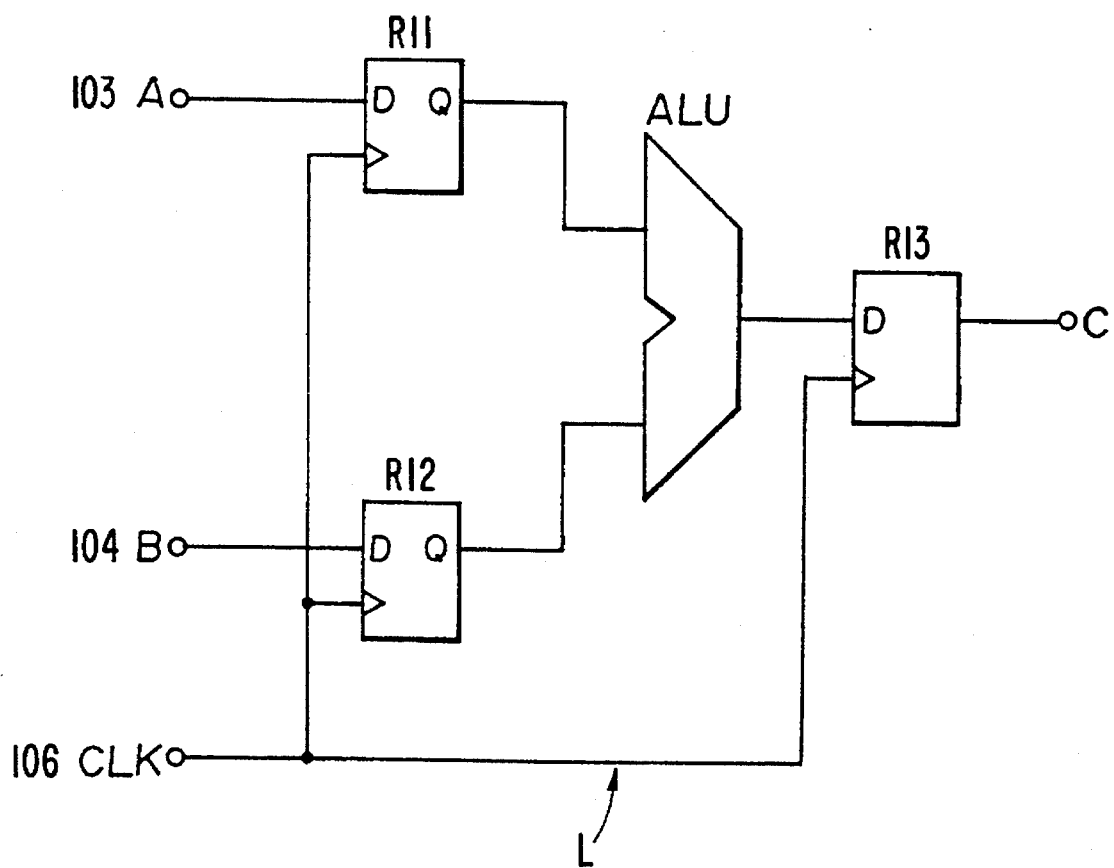
FIG. 3 is a block diagram of the arithmetic logic circuit for the example in the related art.

A detailed description will be given with reference to the diagrams of an example of a synchronization circuit for this invention. FIG. 1 (4) is a view outlining the construction of a first embodiment of this invention. That shown in FIG. 1 (4) is suitable for use as a synchronization circuit.

In the invention shown in this diagram, the clock line L connected to the terminal 112 is folded back at a predetermined length to form a pair of clock lines of the same length and these end terminals then become the terminal 1. The clock signal CLK is provided to terminal 112. The clock signal CLK is provided to the D type flip-flops FF11 to FF13 which require clock signals via their respective center phase generators M1 to M3.

The point at which the clock line L is bent over is made to be PO. The clock signals for the center phase generators M1 to M3 are then provided via the pair of clock lines La and Lb at equal distances from this bent over point PO.

For example, the signal for the center phase generator M1 is taken from the points P1 and P2 which are an equal distance from the bend over point PO. As the transmission distance when viewing from terminal 112 which provides the signal is different for the clock signals CLK11 and CLK16, the phase of these signals is therefore different.

In the same way, the clock signals CLK 12 and CLK 15 are provided to the center phase generator M2 via points which are of an equal distance from the bent over point PO, as are the clock signals CLK 13 and CLK 14 which are provided to the center phase generator M3.

Unit clock signals 10 are then generated for the respective center phases at the center phase generators M1 to M3 based on the different phase clock signals.

A clock signal CLK 10 is formed so as to have a leading edge or falling edge which falls midway between the leading edges or falling edges for the pairs of clock signals inputted to the center phase generators M1 to M3. This clock signal CLK 10 having this new center phase would have the same phase even if it was taken as the output from one of the center phase generators M1 to M3. This means that when viewed from the bend over point PO for the clock line L, the distances to the positions where each of the clock signals are taken off for the center phase generators M are equal.

Taking the intermediate delay and the terminal 112 as criteria, phase delays due to shifts in the clock signal delays occur as a result of these signals being transmitted from terminal 112 to the bend over point PO.

Figure 5:
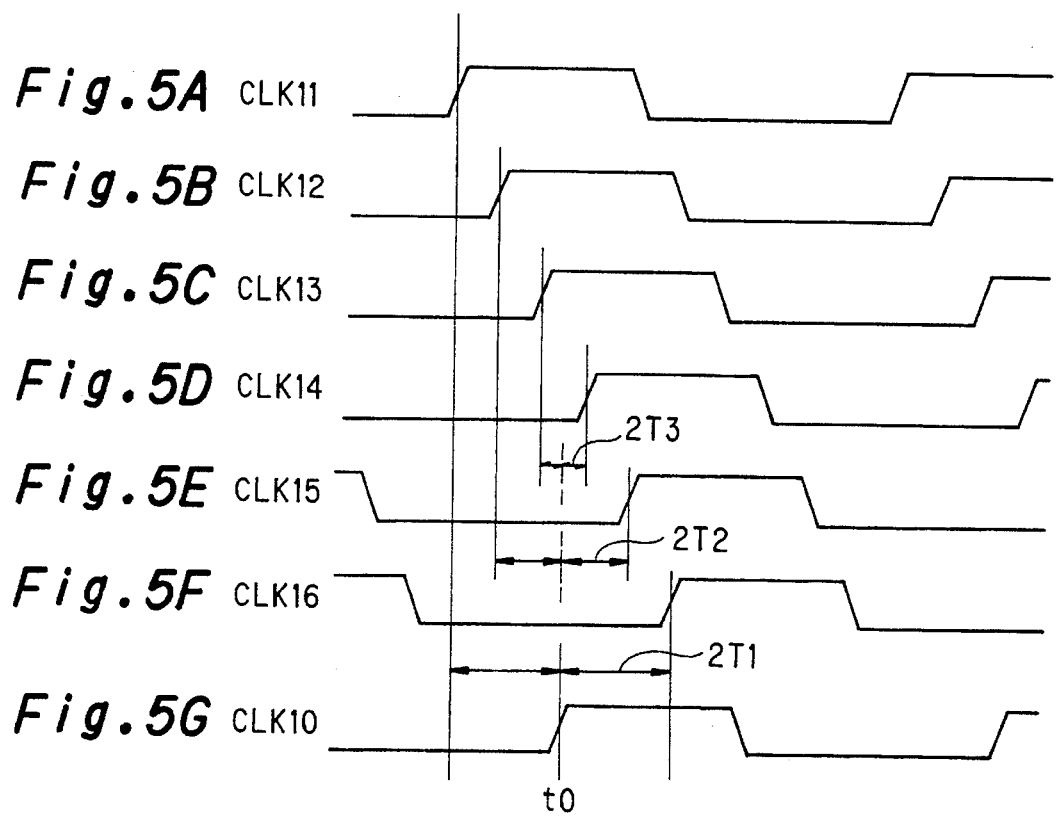
FIG. 5, comprised of FIGS. 5A–5G is a view describing the skew occurring in the clock synchronizing circuit in FIG. 4.

A description will be given with reference to FIG. 5. Delays occur in the clock signal CLK due to it's being transmitted along the clock line La. Delays of a predetermined time period therefore occur sequentially between the clock signals CLK 11 to CLK 16. The clock signal CLK 10 goes high at the point in time t0 which occurs after a period T1 (i.e. the half-way point) of the time period 2T1 regulated by the difference between the timing of the rising edges for the clock signal CLK 11 and CLK 16 at the center phase generator M1.

In the same way, at the center phase generator M2, the clock signal CLK 10 goes high at the point in time t0 (this point in time t0 is exactly the same point in time as the point t0 mentioned above) which occurs at the midway point of the time period 2T2 regulated by the difference between the timing of the rising edges for the clock signal CLK 12 and CLK 15. Also, at the center phase generator M3, the clock signal CLK 10 goes high at the point in time t0 which occurs at the midway point of the time period 2T3 regulated by the difference between the timing of the rising edges for the clock signal CLK 13 and CLK 14. It follows that a clock signal CLK of the same phase is outputted from each of the center phase generators M1 to M3.

Second Embodiment

Figure 6:
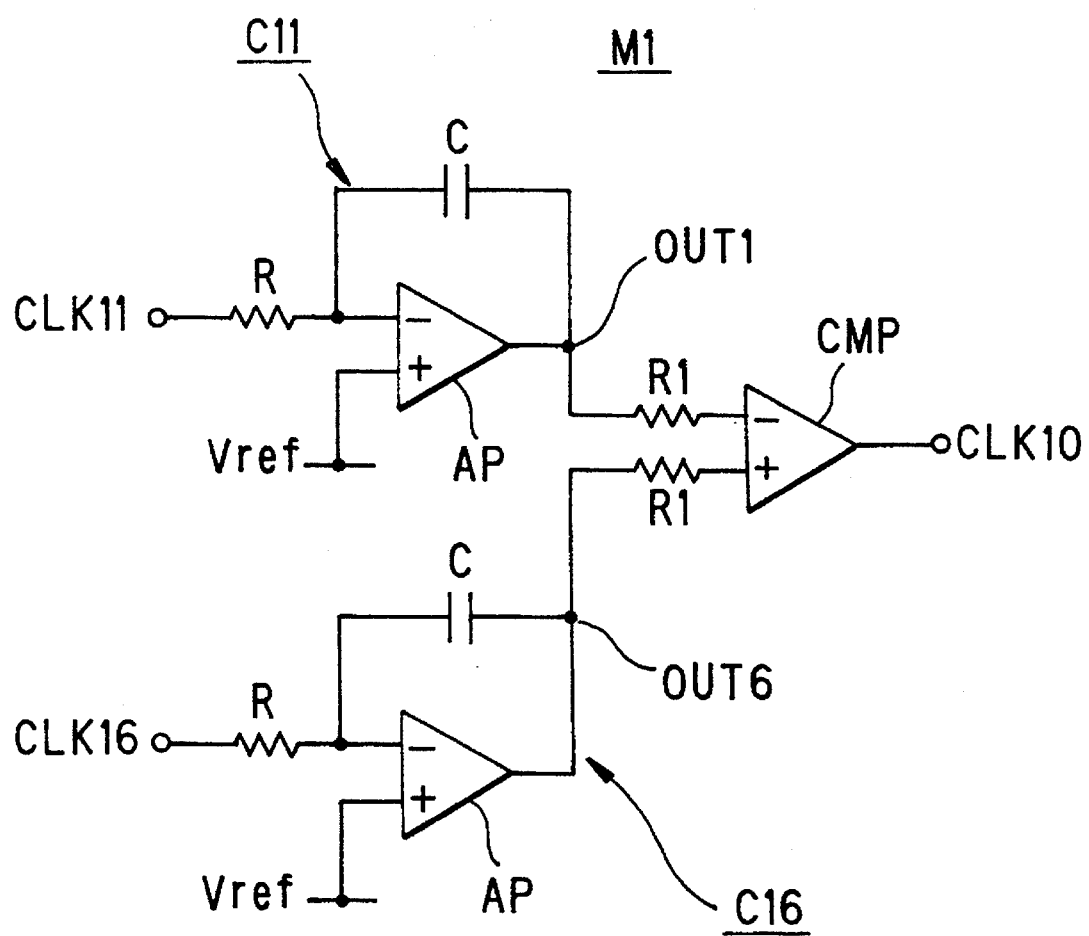
FIG. 6 is a circuit diagram of the construction of a center phase generator for a second embodiment of this invention.

An example of a construction for any of the center phase generators M1 to M3 is shown in FIG. 6. In the following description, the center phase generator M1 is taken as an example. This center phase generator M1 is made up of items such as integrators C11 and C16, resistors R1 and comparators CMP. Taking the center phase as a basis, the clock signal CLK 11 on the non-delayed side goes to the inverting terminal side of the comparator CMP via the integrator C11 and the resistor R1. The clock signal CLK 16 which is on the side which is delayed with respect to the center phase taken as a basis then goes to the non-inverting side of the comparator CMP via the integrator Cl6 and the resistor R1.

At the integrator C11, a capacitor C is connected across the output terminal and the inverting terminal of the amplifier AP so as to form a feedback loop, and a resistor R is also connected to this inverting terminal. Reference voltages Vref are then provided to the non-inverting terminals of the amplifiers for both the integrator C11 and the integrator Cl6.

The clock signal CLK 11 is provided to the integrator C11 and the clock signal CLK 16 is provided to the integrator Cl6. When these clock signals CLK 11 and CLK 16 are high, there is discharge, and when they are low, charging takes place. This results in the output voltage waveforms OUT 1 and OUT 6 shown in FIG. 7(C) for the integrators C11 and Cl6.

The output voltage waveforms OUT 1 and OUT 6 are compared at the comparator CMP, and when OUT 6 is greater than OUT 1, the comparator CMP outputs a high level signal and the clock signal CLK 10 is obtained when the clock signals CLK 11 to CLK 16 vary between GND (earth potential) and Vt the reference voltage Vref may be taken to be Vt/2, and when the clock signals vary between (−Vt) and Vt, it is referable to make the reference voltage Vref as GND.

In the aforementioned example the duty is, for example, 50%. However, if the duty is not 50%, drifting occurs in the d.c. component of the outputs from the integrators Cl and normal operation is difficult. This situation is shown in FIG. 8. In the example in FIG. 8, FIG. 8A shows a clock signal CLK which does not have a duty ratio of 50% and FIG. 8B shows the output voltage waveform OUT for the integrators Cl. It is apparent from FIG. 8B that there is drifting in the d.c. component of the output voltage waveform OUT when the duty is not 50%.

Third Embodiment

An integrator for a third embodiment of this invention which is not affected by the duty ratio of the clock signal CLK is shown in FIG. 9. In FIG. 9, items such as a d.c. component detector 11 and an inverting amplifier 12 are added to the integrator Cl made up of made up of the resistor R1, the capacitor C11 and the amplifier AP11.

In FIG. 9, a d.c. component detector made up of a resistor R12 and a capacitor C12 is connected in series to the output side of the integrator Cl. For example, as the time constant t 12 (=R12 ×C12) has a value which is large when compared with that for the clock signal CLK, the d.c. component, only, of the output voltage waveform OUT 1 outputted. The potential at the midpoint between the resistor R12 and the capacitor C12 is then provided to the inverting amplifier 12 and the reference voltage is connected to one side of the capacitor C12.

The inverting amplifier 12 is made up of the amplifier AP13 and the resistors R13 and R13. A connection is made to the inverting terminal of the amplifier AP13 via the resistor R13 connected to the midpoint between the resistor R12 and the capacitor R13. The output terminal of the amplifier AP 13 is connected to the inverting terminal on the input amplifier side and provides feedback into the non-inverting terminal of the amplifier AP11 in the integrator circuit Cl.

A description will be given of the circuit operation and the d.c. drift with reference to FIG. 9 and FIG. 10.

Figure 10:
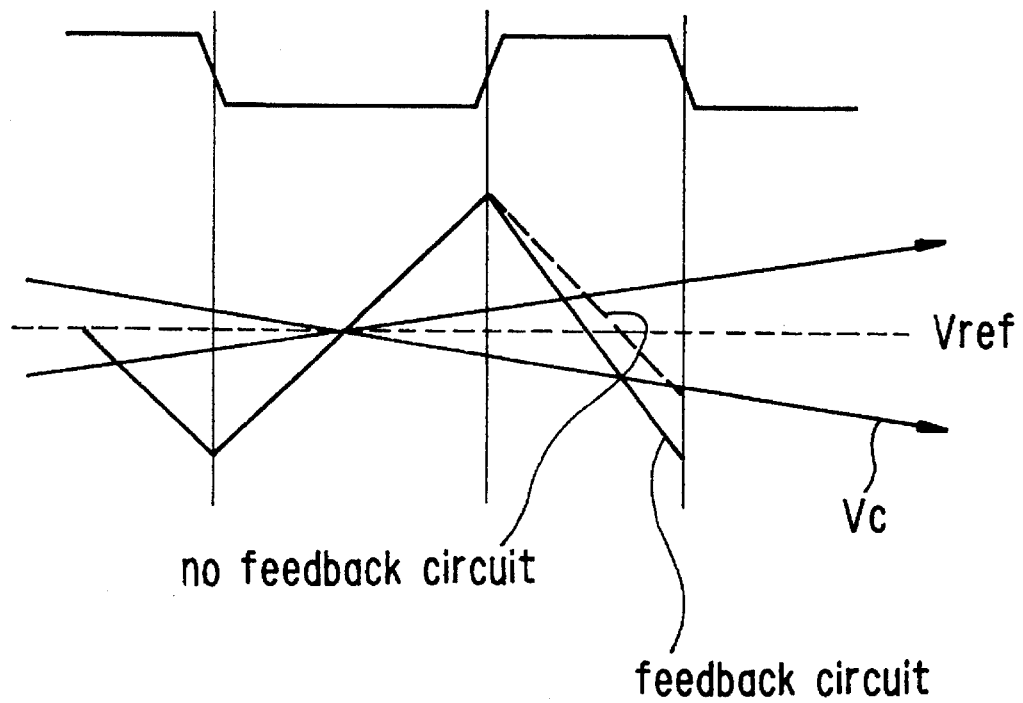
FIG. 10 is a view describing how the d.c. drift is resolved in the integrator in FIG. 9.

For example, when the d.c. drift is in the positive direction as is shown in FIG. 10, the output voltage Vc for the inverting amplifier AP12 drifts in the negative direction. In doing so, as the potential difference between the clock signal CLK and the output voltage Vc becomes large, the charging current I for the capacitor C11 in the integrator Cl becomes large. When there is then a larger swing in the clock signal CLK, the operation is such that the d.c. drift becomes zero.

Figure 4:
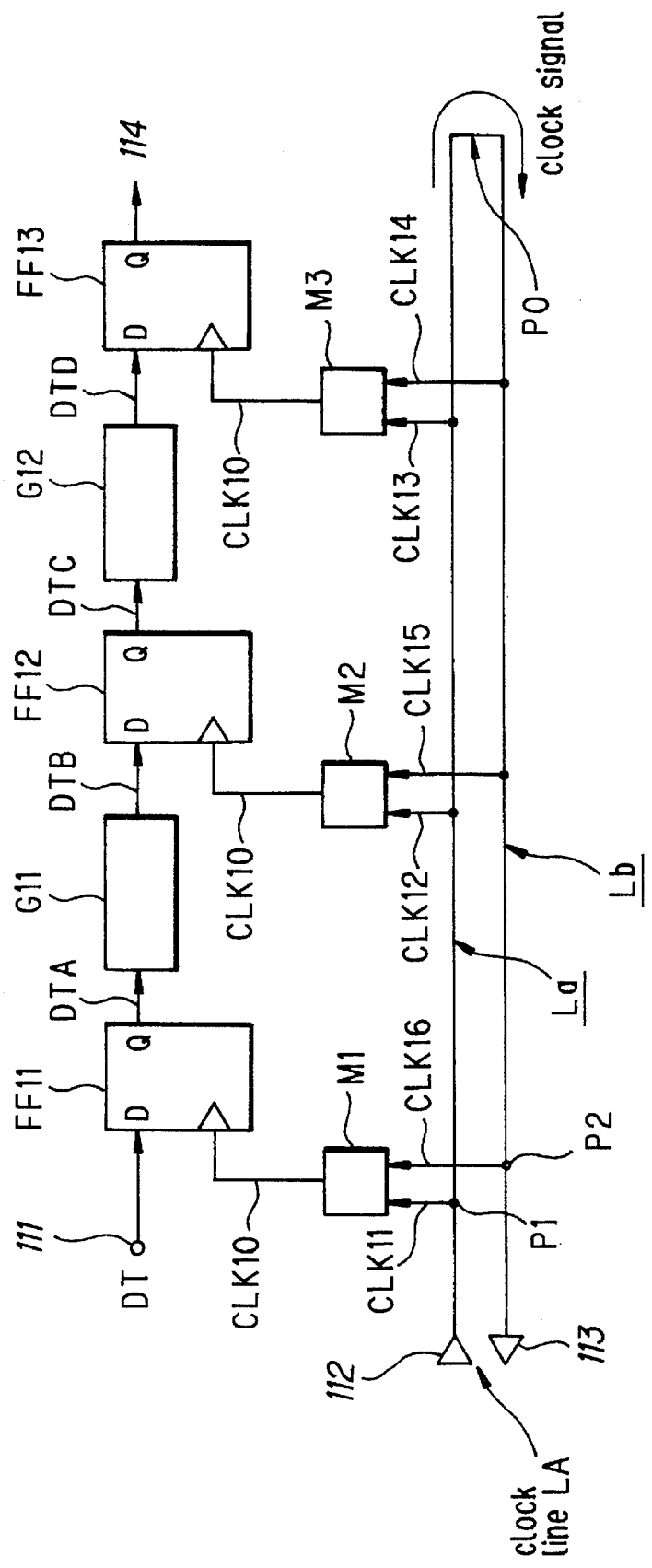
FIG. 4 is a view of the clock synchronizing circuit for a first embodiment of this invention.

According to the construction in FIG. 4, pairs of clock signals having differing phases are supplied to are provided to their respective center phase generators M1 to M3 via points which are at equal distances from the bent-over point PO for the clock lines LCK which are bent over into a pair. A clock signal CLK 10, having a phase which falls midway between the two types of different phases for these clock signals is formed and the flipflops FF11 to FF13 are driven at the same frequency as this new clock signal CLK 10. This means that the hold time tHOLD can be maintained at a fixed length so that the generation of errors can be avoided.

Fourth Embodiment

A fourth embodiment of this invention will now be described with reference to FIG. 11 and FIG. 12.

The skew within synchronization circuits set up using the kind of center phase generators M1 to M3 in the aforementioned embodiments can be improved upon. i.e. by generating an center phase, as before, there is an intermediate portion phase lag between the clock signal CLK provided to the terminal 112 and the newly generated clock signal CLK 10.

In the following embodiment, the phase of the new clock signal CLK 20 can be adjusted to meet that of the external clock signal CLK provided to the terminal 112 so that the center phase portion can be merged.

A description will be given with reference to FIG. 11 in which the construction in FIG. 4 is simplified and then just one part is shown. In this embodiment, a clock signal CLK 20 is made for use within the synchronization circuit which uses the kind of center phase generator M31 shown in FIG. 11. The phase error between this and the external clock CLK is then found at the phase detector 136 and this is controlled by PLL 135 so as to become zero.

Figure 11:
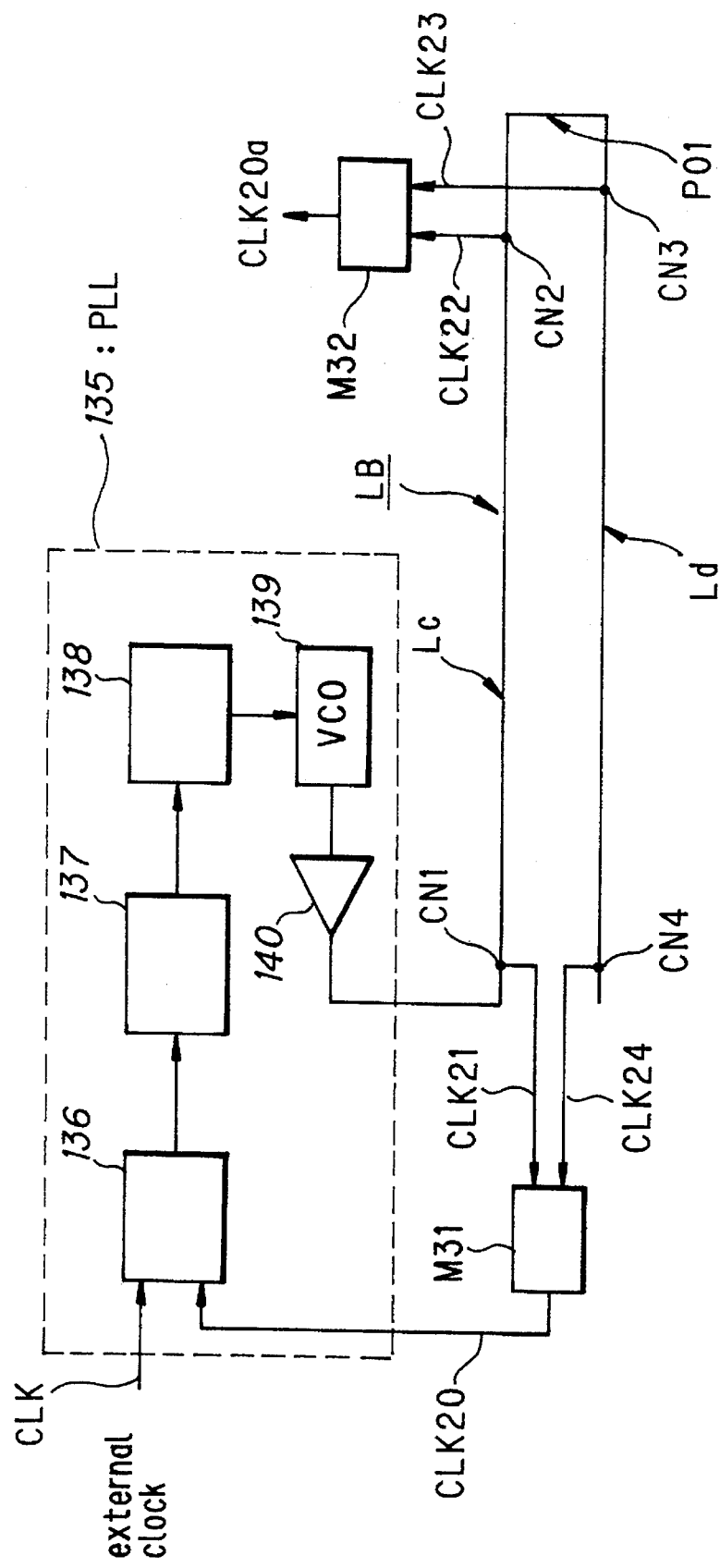
FIG. 11 is a block diagram showing the PLL system for a fourth embodiment of this invention.

In FIG. 11, the clock signals CLK 22 and CLK 23 of differing phase are sent to the center phase generator M32 via the connection points CN2 and CN3 which are positioned at an arbitrary equal distance from the bent over point PO. The clock signals CLK 21 and CLK 24 of differing phases are provided to the center phase generator M31 via the connection points CN1 and CN2.

The clock signal 20a shown in FIG. 12E is then formed from the clock signal CLK 22 shown in FIG. 12F and the clock signal CLK 23 shown in FIG. 12G at the center phase generator M32.

Then, at the center phase generator M31, the clock signal 20 (=CLK c) shown in FIG. 12B is then formed from the clock signal CLK 21 shown in FIG. 12C and the clock signal CLK 24 shown in FIG. 12D. This clock signal CLK 20 is then sent to the phase comparator 136 within PLL135 along with the external clock signal CLK(12A).

The phase error between the clock signal CLK 20 and the external clock signal CLK is then found at the phase comparator 136. This phase error is then boosted by the charge pump 137 before being sent to the low pass filter 138, it is reduced to being just it's low component and this is then sent to the voltage controlled oscillator (VCO). A frequency signal corresponding to the value of the d.c. voltage provided by the low pass filter 138 is then generated at the VCO 139 and this is sent to the CN1 side of the clock line LC via the buffer 140. In this way, a feedback loop which includes the center phase generator M31 is formed.

In order to achieve a time delay of a predetermined time delay and waveshape, for example, two inverters having the same input/output phase may be connected in series at bent over point PO of the clock line L. This structure is also in FIG. 1.

With this kind of PLL loop construction, by being able to adjust the phase of the new clock signal CLK 20 generated within the synchronous circuit to the phase of the externally provided clock signal, it is possible to null the phase difference of the external clock.

Fifth Embodiment

Figure 13:
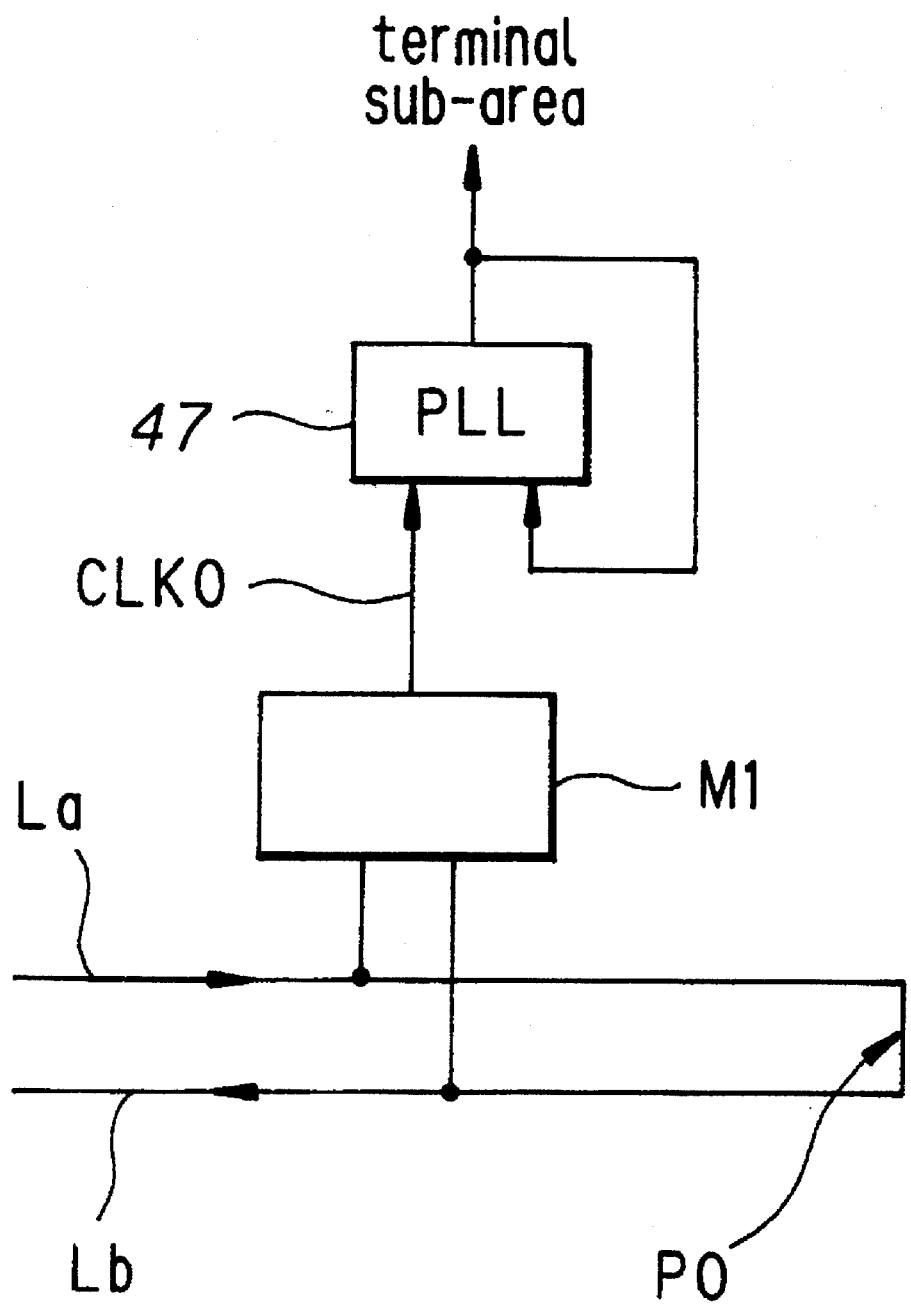
FIG. 13 is a block diagram of a clock synchronizing circuit according to a fifth embodiment of this invention.

So, if the output load for the center phase generators M31 and M32 is large or there are problems with phase shifts caused by items such as the buffer means, by using an embodiment of this invention, one part of which is shown in FIG. 13, phase shifts occurring at the terminal can be removed by using a further local PLL 47 for driving the terminal sub-area.

According to the construction of the invention described above, when clock signals are taken from a clock line, a plurality of clock signals having the same phase can be obtained simultaneously without being effected by the position on the clock line from where the clock signals are taken.

Also, as a clock signal having a prescribed phase generated in internal circuitry can be made to have the same phase as an external clock signal, this invention can be used to make a high speed synchronizing circuit which is highly precise.

What is claimed is:

1. A clock synchronizing circuit which synchronizes circuit elements using clock signals taken from a common clock line, with said clock line being bent midway to form a pair of clock lines, comprising:

center phase signal generating means for generating a clock signal having a phase which is midway between respective phases of two clock signals of differring phase, said two clock signals having been taken from arbitrary points on said pair of clock lines at equal distances from the point at which said pair of clock lines are bent over.

2. A clock synchronizing circuit according to claim 1, said center phase signal generating means comprising: a first integrator; a second integrator, and a comparator which compares voltages outputted by both integrators, wherein a clock signal of a prescribed duty ratio is outputted when the voltage outputted from one integrator is higher than the voltage outputted from the other.

3. A clock synchronizing circuit according to claim 2, each of said integrators including: a d.c. component detector circuit set up at an output terminal of said integrator; an inverting amplifier for providing amplification and for reversing an phase of the output from the d.c. component detector and; a feedback path from an output of said inverting amplifier to an input of said integrator, wherein a clock signal of an arbitrary duty ratio is generated.

4. A clock synchronizing circuit which synchronizes circuit elements using clock signals taken from a common clock line, with said clock line being bent midway to form a pair of clock lines, comprising:

center phase signal generating means for generating a clock signal having a phase which is midway between respective phases of two clock signals of differring phase, said two clock signals having been taken from arbitrary points on said pair of clock lines at equal distances from the point at which said pair of clock lines are bent over; and a PLL set up between said center phase signal generating means and said clock line, for adjusting the phase of the clock signal outputted from said center phase signal generating means to the phase of an external clock.

* * * * *